US007248756B2

(12) United States Patent
Ebbesen et al.

(10) Patent No.: US 7,248,756 B2
(45) Date of Patent: Jul. 24, 2007

(54) APPARATUS COMPRISING ELECTRONIC AND/OR OPTOELECTRONIC CIRCUITRY AND METHOD FOR REALIZING SAID CIRCUITRY

(75) Inventors: Thomas Ebbesen, Strasbourg (FR); Per-Erik Nordal, Asker (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/984,923

(22) Filed: Nov. 10, 2004

(65) Prior Publication Data
US 2005/0081913 A1 Apr. 21, 2005

Related U.S. Application Data

(62) Division of application No. 09/720,084, filed as application No. PCT/NO00/00137 on Apr. 27, 2000, now Pat. No. 6,856,715.

(30) Foreign Application Priority Data
Apr. 30, 1999 (NO) ................. 19992124

(51) Int. Cl.
G02B 6/12 (2006.01)
G02B 6/00 (2006.01)
C07C 5/42 (2006.01)
G09G 3/28 (2006.01)

(52) U.S. Cl. ............... 385/14; 385/12; 600/380; 345/67

(58) Field of Classification Search ........... 385/14, 385/12; 600/380; 345/67
See application file for complete search history.

(56) References Cited

U.S. PATENT DOCUMENTS

| 3,601,532 | A | * | 8/1971 | Bitzer et al. ............... 348/797 |
|---|---|---|---|---|
| 4,521,771 | A | | 6/1985 | Alton |
| 4,772,092 | A | | 9/1988 | Hofer et al. |
| 5,052,777 | A | | 10/1991 | Ninnis et al. |
| 5,524,679 | A | | 6/1996 | Wiener |
| 5,829,979 | A | | 11/1998 | Kobashigawa et al. |
| 5,876,863 | A | | 3/1999 | Feldman et al. |
| 5,906,004 | A | | 5/1999 | Lebby et al. |
| 6,160,529 | A | * | 12/2000 | Asao et al. ................... 345/60 |
| 6,210,771 | B1 | | 4/2001 | Post et al. |
| 6,239,779 | B1 | * | 5/2001 | Furuya et al. ............... 345/87 |
| 6,288,692 | B1 | * | 9/2001 | Kanazawa et al. .......... 345/67 |
| 6,381,482 | B1 | * | 4/2002 | Jayaraman et al. ........ 600/388 |
| 6,410,948 | B1 | * | 6/2002 | Tran et al. ................ 257/202 |
| 6,419,981 | B1 | | 7/2002 | Novich et al. |

FOREIGN PATENT DOCUMENTS

DE 3116348 A1 9/1982

(Continued)

OTHER PUBLICATIONS

G. Horowitz, "Organic Field-Effect Transistors" Advanced Materials, vol. 10, pp. 365-377; (1998).

(Continued)

*Primary Examiner*—K. Cyrus Kianni
(74) *Attorney, Agent, or Firm*—Birch, Stewart, Kolasch & Birch, LLP

(57) ABSTRACT

An apparatus/method for producing fabric-like electronic circuit patterns created by methodically joining electronic elements using textile fabrication-like methods in a predetermined arrangement.

11 Claims, 13 Drawing Sheets

FOREIGN PATENT DOCUMENTS

| EP | 06298 A2 | 9/1992 |
|---|---|---|
| FR | 2561789 | 9/1985 |
| FR | 002561789 A1 | 9/1985 |
| JP | 185453 A2 | 7/1990 |
| JP | 05299533 | 11/1993 |
| WO | WO 9638025 A1 | 11/1996 |
| WO | WO 98/58383 | 12/1998 |
| WO | WO 9858383 | 12/1998 |
| WO | WO 99/14762 | 3/1999 |
| WO | WO 9914762 A1 | 3/1999 |

OTHER PUBLICATIONS

D. Pede et al., "A General-Purpose Conjugated-Poloymer Device Array for imaging" Advanced Materials, vol. 10, pp. 233-237 (1998).

R.H. Friend, et al., "Electroluminescence in Conjugated Polymers", Nature 397, pp. 121-128 (1999).

J.G. Blake, et al., "Low-temperature polysilicon reshapes FPD production", Solid State Technology, pp. 151-161 (May 1997).

J.R. Heath, et al., "A Defect-Tolerant Computer Architecture: Opportunities for Nanotechnology", Science, vol. 280, pp. 1716-1721 (Jun. 12, 1998).

H. Yabe, et al., "Direct writing of conductive aluminum line on aluminum nitride ceramics by transversely excited atmospheric C02 laser", APL 71 pp. 2758-2760 (1997).

S.E. Braddock, et al., "Techno Textiles-Revolutionary Fabrics for Fashion and Design", chap. 2, Thames & Hudson, New York 1998.

B. Shieh, et al., "Air gaps lower k of interconnect dielectrics", Solid State Technology, pp. 51-58 (Feb. 1999).

P. Horowitz, et al., "The art of electronics", pp. 455-466, Cambridge University Press, ISBN 0-521-37095-7, no year.

Y. Zhang, et al., "Coaxial nanocable: Silicon Carbide and Silicon Oxide Sheathed with Boron Nitride and Carbon", Science, vol. 281, pp. 973-975 (Aug. 14, 1998).

* cited by examiner

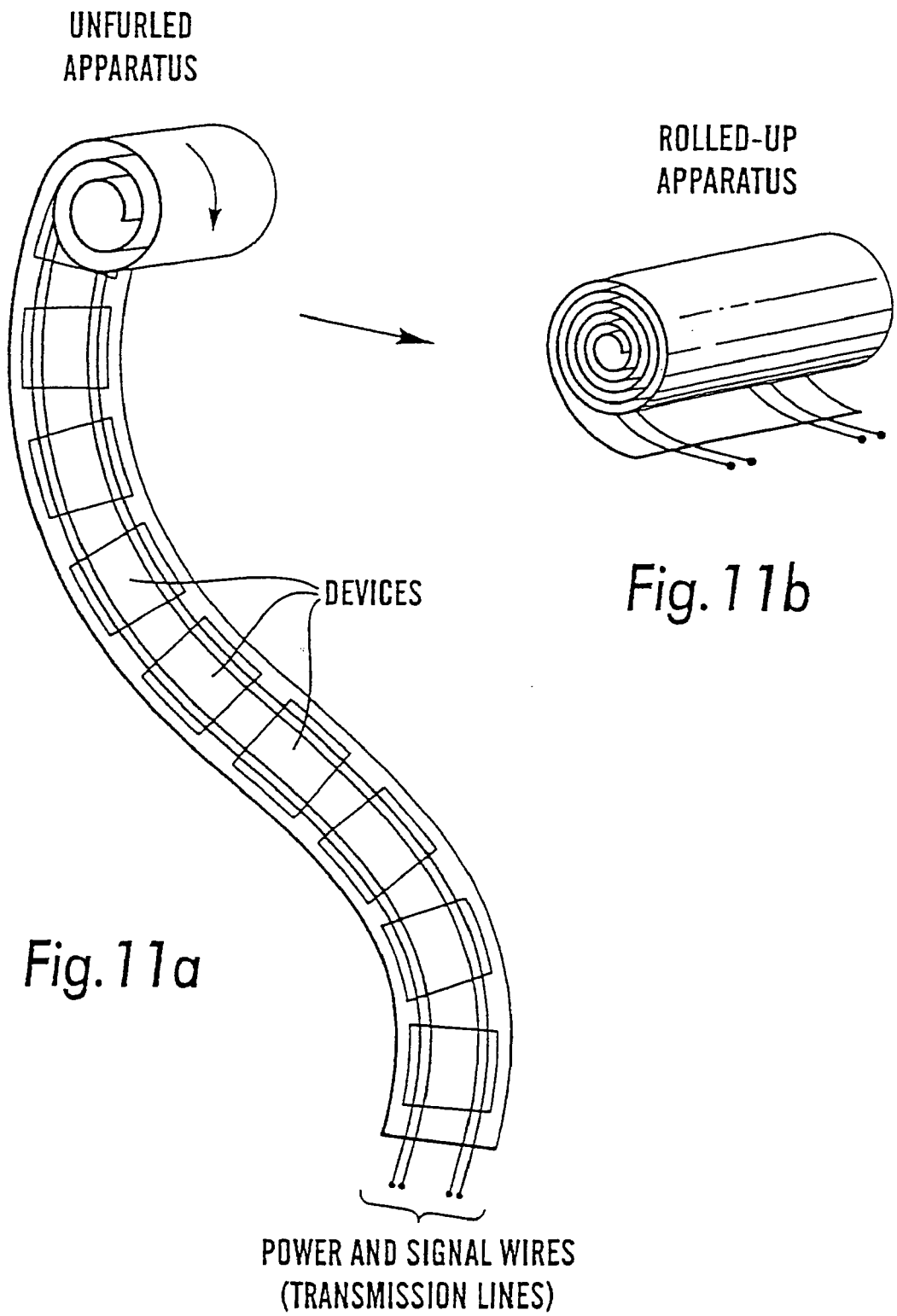

US 7,248,756 B2

APPARATUS COMPRISING ELECTRONIC AND/OR OPTOELECTRONIC CIRCUITRY AND METHOD FOR REALIZING SAID CIRCUITRY

This application is a Divisional of application Ser. No. 09/720,084 filed on Dec. 20, 2000 now U.S. Pat. No. 6,856,715 and for which priority is claimed under 35 U.S.C. § 120. Application Ser. No. 09/720,084 is the national phase of PCT International Application No. PCT/NO00/00137 filed on Apr. 27, 2000 under 35 U.S.C. § 371. The entire contents of each of the above-identified applications are hereby incorporated by reference. This application also claims priority of Application No. 19992124 filed in Norway on Apr. 27, 2000 under 35 U.S.C. § 119.

BACKGROUND OF THE INVENTION

1. Field of the Invention

The present invention relates to a fabric-like array of electronic and/or optoelectronic circuitry and a method for forming the fabric-like array in two- or more dimensions.

The present invention concerns an apparatus comprising electronic and/or optoelectronic circuitry for implementing electronic and/or optical functions, wherein the circuitry is realized and/or integrated in two or more dimensions and a method for method for realizing and/or integrating circuitry in two- or more dimensions, wherein the circuitry comprises elements in the form of wires, fibres, ribbons, strips or multicomponent filaments and/or combinations thereof, wherein said circuitry is electronic and/or optoelectronic circuitry for implementing electronic and/or optical functions in an apparatus comprising circuitry of this kind.

More particularly, the present invention relates to integrating filament-like electrical and/or optical conduits into two- and three-dimensional physical structures for creating electronic or optoelectronic circuitry, sensors and/or emitters. The spatial extent or region of influence of such circuitry, sensors and/or emitters is controlled by specific definition of the electrical and/or optical properties of the individual filaments and how they are incorporated into the structures.

In particular, the present invention concerns integrating filament-like electrical and/or optical conduits into two- and three-dimensional physical structures for creating electronic or optoelectronic circuitry, sensors and/or emitters. The spatial extent or region of influence of such circuitry, sensors and/or emitters is controlled by specific definition of the electrical and/or optical properties of the individual filaments and how they are incorporated into the structures.

2. Background Information

The development of integrated circuits on silicon and semiconductor compound materials has revolutionized the electronic industry. However, the ever increasing complexity and costs of higher integration technology has generated interest in novel materials and methods.

The development of integrated circuits on silicon and semiconductor compound materials has revolutionized the electronic industry. However, the ever increasing complexity and costs of higher integration technology has generated interest in novel materials and methods.

For instance, progress in conductive polymers and organic materials has led to novel displays, diodes and field-effect transistors using these materials. See G. Horowitz "Organic field effect transistors" Adv. Mat. Vol. 10, pp. 365–377 (1998); D. Pede & al. "A general-purpose conjugated-polymer device array for imaging" Adv. Mat. Vol 10, pp. 233–237 (1998); R. H. Friend et al. "Electroluminescence in Conjugated 'Polymers'", Nature 397, pp.121–128 (1999).

Thin-film-based inorganic semiconductor technologies compatible with low temperature-resistant packaging and substrate materials are under rapid development, and include amorphous silicon as well as polysilicon and microcrystalline silicon. In this connection, see, e.g. J. G. Blake & al., "Low-temperature polysilicon reshapes FPD production", Solid State Technology, pp.151–161 (May 1997).

Defect tolerant architectures have been proposed to circumvent the problems of trying to produce defect free chips, for instance by J. R. Heath & al., "A defect-tolerant computer architecture: opportunities for nanotechnology", Science, Vol. 280, pp. 1716–1721 (Jun. 12, 1998).

Such novel materials and methods open up entirely new opportunities in electronics and optoelectronics that extend much beyond providing an evolutionary route to alleviating problems and limitations adhering to the present state of the art. Unfortunately, present-day semiconductor-oriented technologies are totally inadequate for exploiting the true potential of these novel materials and methods, and there exist pressing needs for complementing technologies. One area of particular importance is that of gaining freedom from the dominating role of the substrate.

In traditional silicon-based technologies, the electronic functionality is derived from the semiconducting silicon substrate, which severely restricts opportunities for extensions into the third dimension. Furthermore, physical dimensions are restricted, and the traditional lithographic processes provide only limited flexibility with respect to intra-device connectivity. This includes both the physical characteristics of the connecting lines themselves and how they can be positioned throughout the device structures in question. Typically, the substrate and its layered superstructures contain electrical interconnects where electric currents flow in patterned strip- or ribbon-like conducting paths that have been created by subtractive or additive processes.

Subtractive processes are well-known and much used in the semiconductor industry, and involve wet or dry etching whereby conducting material is removed from portions of the substrate. Conducting material is retained in regions where a protective layer has been applied in the patterns desired, e.g. by optical lithography. Typically, all modern microelectronic circuits involve multiple step lithography processes where image(s) of parts or all of the circuitry, mostly wires, and devices are transferred to the substrate. This requires careful register between each step, the more so as the features become smaller and smaller. The substrate must be extremely flat and rigid. Furthermore, the circuitry cannot be continuous through this approach. Several chips have to be made individually on one wafer at the time. Furthermore, the integration of electronic and optoelectronic circuits is extremely difficult by such methods. It would therefore be highly advantageous to find microcircuit fabrication methods which eliminate lithographic processes altogether and allow for flexible continuous fabrication of electronic and optoelectronic circuits.

Additive processes have hitherto been less used in electronic circuits, but may become important in the future. They include microprinting and micromolding of conducting inks or solid state conductors, screen printing and more exotic means such as laser mediated deposition (see, e.g.. H. Yabe & al., "Direct writing of conductive aluminum line on aluminum nitride ceramics by transversely excited atmospheric CO2 laser", APL 71 2758 (1997)).

The present invention introduces the concept of woven electronics as a new generic approach to making and assembling electronic and optoelectronic devices and apparatus, in particular by exploiting opportunities that arise with the advent of novel electronic materials. This implies a radical departure from present state of the art.

This is substantiated by searches performed in the literature have to a small extent been able to identify any relevant prior art. Yet there is for the sake of completeness in order to briefly discuss patent documents which touch upon circumstances of general relevance for the present invention.

Thus there is from DE 31 16 348 A1, "Elektrische Verbindungseinrichtung" (Oscar Alonso, USA), and WO96/38025 A1, "Composite materials" (Geroge William Morris, Great Britain) known substrates which incorporate woven layers with electrical conduits. The latter are, however, applied after the weaving process has been finished, by methods such as etching, printing or electron sputtering.

JP-05299533, "Electronic part mounting board and electronic part device using the same" (Ohigata Naoharu, Japan) discloses a woven structure incorporating conducting wires interspersed with electrically insulating filaments. However, the focus is here substantially on providing alternative substrates to replace circuit mounting boards subjected to thermal and mechanical stress and the publication discloses in principle neither a new kind of functionality nor novel apparatuses which can be seen to be of relevance for the present invention.

Further can be mentioned U.S. Pat. Nos. 4,913,744 and 5,902,416 (both H. Hoegel & al.) which concern wire-like, band-like and rod-like solar cells which in at least one embodiment are provided in a woven structure. It is stated that the separate solar cells in the woven structure can be electrically connected at the underside of the crossing in the web with a counter-electrode in order to realize charge transfer between centre electrodes of the solar cells. It is also stated that the contact effect can be improved by a compression of solar cells in the form of wires or the crossing points either by thermal treatment or by use of electrically conducting adhesive. The object in this case is to achieve an improved arrangement of the solar cells, including among other by allowing the realization of tandem cells.

Generally there is both from the patent literature and other literature known to include conducting metal wires by weaving into a large number of objects. This includes meshes, which e.g. act as electrical shielding in housings, and electrodes and filters in material science. Metallic fabrics and metallic embroidery are used to make decorative and protective clothes. Conducting wires are integrated in fabrics to provide clothing and furniture, which prevent the formation of electrostatic charge or alternatively used for providing electrical heating. In so-called "smart clothes" such woven structures may for instance be used for connecting or providing the clothes and apparels with electronic devices and sensors. For instance can in this connection be mentioned U.S. Pat. No. 5,906,004 (Lebby & al.) (assigned to Motorola Inc.) which discloses a textile fabric with a number of electrically conducting fibres, which are able to provide either a wire-based or wireless connection between the textile fabric and a portable electronic device. The intention is that the textile fabric may be used for manufacturing functional clothes and other objects of woven textile fabric with the intention of increasing the functionality of the clothing or the functionality of the object. Typically are electrically conducting fibres disclosed in the capacity of providing an interconnection to a portable electronic device of some kind or other. Concerning the development in this area it can also generally be referred to S. E. Braddock and M. O'Mahony, "Techno Textiles—Revolutionary Fabrics for Fashion and Design", ch. 2, Thames and Hudson, New York (1998). Summing up a survey of the prior art illuminated by the above-mentioned patent literature and other literature shows that the use of a woven structure which provides electrically conducting and electrically screening functions is per se well-known and the same is also the case for uses of such structures for providing electrical connections between discrete, separate or surface-mounted devices. Inherent features of such woven structures for providing a more comprehensive electronic or optoelectronic functionality is not touched upon at all.

To conclude, in order to realize the potential in a wide range of emerging electronic and optoelectronic materials and methods, there is a need for complementing technologies which are not within the present-day state of the art. Prominent among such technologies are those that can provide electrical and optical interconnections in two and three dimensions, with high spatial density, high signal speed potential and small crosstalk. Also prominent are technologies and materials suitable as structural platforms for large area electronics and/or three dimensional device architectures.

SUMMARY OF THE INVENTION

A primary object of the present invention is to provide a lithography-free process to produce electronic and optoelectronic devices, apparatus and circuits in sheet-like or fabric form, or in three dimensional structures.

A primary object of the present invention is to provide a lithography-free process to produce electronic and optoelectronic devices, apparatus and circuits in sheet-like or fabric form, or in three dimensional structures.

It is a further object of this invention to provide for continuous circuits over large areas and in mechanically flexible final products which can be shaped to a desired environment or form factor.

It is still a further object of the present invention to provide intra- and inter-device electrical and optical connections that can carry high-speed signals with very low crosstalk.

Another object of the invention is to provide methods to integrate electronic and optical circuits in a continuous matrix.

Yet another object of the invention is to create functional devices by weaving, knitting, crocheting, knotting, stitching and/or combinations thereof.

The above-mentioned objects and advantages are according to the invention realized with an apparatus wherein the circuitry comprises elements in the form of wires, fibres, ribbons, strips, or multicomponent filaments and/or combinations thereof, said elements interfacing in a predetermined pattern such that said circuitry are realized with intersections in physical or near physical contact between the elements thereof, wherein said predetermined pattern is generated by integrating physically two or more of said elements in a fabric-like structure by any of the following processes, viz. weaving, knitting, crocheting, knotting, stitching and/or combinations thereof, wherein said elements include transparent, non-transparent, conducting, semiconducting or insulating materials and/or combinations thereof, wherein at least some of said elements according to their material properties form electrical or optical transmission lines or isolators in said circuitry, said electrical or optical transmission lines conveying respectively electrical or optical energy between points and/or areas in said fabric-like structure, and or between the apparatus and its surroundings, wherein at least some of said elements comprise spatially defined extended active regions, wherein at least some of said elements in portions of said fabric-like structure are adapted for emitting or absorbing electrical, chemical, mechanical or optical energy or for interacting with each other by an exchange of energy of the aforementioned kinds, wherein switching, coupling, emitting and absorbing mechanism in any case are realized by two or more active areas in respectively one or more elements and which are in mutual physical or near physical contact, whereby active areas in a contact of this kind realizes one or more specific functions or combinations thereof which implements, but are not limited to switching structures and/or diode structures with junctions specified by the materials in the contacting active regions, couplers for transmitting signals between the elements, memory structures for storing information and allowing addressing operations thereto to take place via further contacting, switching and/or coupling structures, and wherein further emitting and absorbing as well as detecting mechanisms are realized by active areas exposed to the exterior, whereby active areas of this kind respectively form display structures for displaying visual information and images and/or sensor structures for sensing and detecting specific physical or chemical influences which are conveyed by means of the elements of the apparatus or from sources exterior to the apparatus, said structures realizing all the above-mentioned mechanisms being integrated in the elements of the apparatus and forming a part thereof.

In an advantageous embodiment of the apparatus according to the invention, the elements are provided in the predetermined pattern forming a substantially two-dimensional fabric-like structure, while in another advantageous embodiment of the apparatus according to the invention the elements are provided in the predetermined pattern forming a substantially three-dimensional fabric-like structure. In the latter embodiment the elements then preferably each are provided in a spatial distribution such that the position of the end-points of the elements in the fabric-like structure defines a spatial pattern or grid.

In advantageous embodiments of the apparatus according to the invention it is preferred that some of the transmission lines respectively are twisted pairs, coaxial cables, strip lines or optical fibres.

In the apparatus according to the invention it is advantageous that the active regions of the elements are defined by exposing portions of the said elements to the exterior surroundings thereof. Preferably are then the active regions of an element lengthwise extended therein or an active region of an element corresponds to an end-point thereof.

In the apparatus according to the invention it is advantageous that some of the elements are provided with a protective shielding or cladding, the active regions in these elements being provided by removing the shielding or cladding at selected portions thereof, or alternatively the active regions of the elements are provided in selected portions of the elements exposed in the surface of the fabric-like structure or protruding therefrom at selected locations thereof.

According to the invention are preferably the active regions of the elements defined by exposing portions thereof to spatially selective physical or chemical influences. In the latter case it is then preferred that some of the transmission lines are at least one conductor embedded in an exterior cladding comprising at least one organic semiconducting material, and that active regions are defined therein by contacting said transmission lines with other transmission lines of the same kind or with other transmission lines in intersection which comprises at least one non-isolated or unclad conductor only, whereby semiconducting junctions are formed at the contact points of said intersections. In this case it is preferred that the semiconducting junctions are formed spontaneously upon contacting, or that at least one of the semiconducting junctions are a diode junction, or that the organic semiconducting material is a semiconducting conjugated or non-conjugated polymer.

In the apparatus according to the invention it is advantageous that at least some of the elements over some of their length are shielded against any interactions in form of an exchange of energy between each other or the exterior surroundings, whereas one or more unshielded portions thereof are adapted for interactions of this kind, and it is then preferred that the unshielded portions of the elements are located at the intersections thereof.

In yet another advantageous embodiment of the apparatus according to the invention it is a two- or three-dimensional optoelectronic display. and the elements are then preferably signal transmission lines. Wherein the display is a two-dimensional display are then the elements provided in a two-dimensional array, preferably such that the elements intersect in a substantially regular pattern or grid, said elements at the intersections thereof being adapted for absorbing or emitting electrical or optical energy. In this case a portion of at least one element in an intersection can be a pixel of the display.

Wherein the display is a three-dimensional display, it is according to the invention preferred that the elements are provided with a predetermined pattern in a three-dimensional array, and then preferably that the elements intersect in a spatially regular pattern or grid, said elements in the intersections thereof being adapted for emitting or absorbing electrical or optical energy. In this case is preferably a portion of at least one element in an intersection a pixel of the display.

Wherein the display is a three-dimensional display with the active regions of the elements provided in selected portions of the element exposed in the surface of the fabric-like structure protruding therefrom at selected locations thereof, it is preferred that the active regions of this kind are pixels in the display, said active regions being either a loop-like portion of an element or an end-point element.

Finally it is in the apparatus according to the invention advantageous that it comprises respectively discrete electronic, optoelectronic or optical devices or combinations thereof, and one or more discrete devices can then preferably be physical or chemical sensors connected to at least one of the elements.

In the apparatus according to the invention it can alternatively be advantageous that one or more of the elements are a physical or chemical sensor.

In the method according to the invention a shielding or cladding material is preferably provided on a surface of the elements before joining into the fabric-like structure, said shielding or cladding material being removed from some elements or from selected portions thereof at selected locations in the fabric-like structure such that at least some of the selected portions form active regions with specific physical properties of material properties.

BRIEF DESCRIPTION OF THE DRAWINGS

The invention shall now be described in more detail, with discussions of exemplary non-limiting embodiments showing various embodiments of the present invention and in conjunction with the appended drawings, wherein:

FIG. 11 shows an example of an apparatus realized as a flexible sheet-like structure.

The invention shall now be described in more detail, with discussions of exemplary non-limiting embodiments showing various embodiments of the present invention and in conjunction with the appended drawings, wherein FIG. 1 shows example of basic weaves such as the plain (a), the triaxial (b), the twill (c), the leno (d) and the satin (e) weaves, FIG. 2 examples of knits such as the plain (a), the double (b), a warp (tricot) (c) knits and various weft knit stitches (d)(e), FIG. 3 examples of multicomponent fabrics such as the weft insertion warp knit fabric (a), pile (b) and carpet (c) fabrics, FIG. 4a–e examples of possible shapes and compositions of the fibers, wires and ribbons composing the electronic or optoelectronic fabric, FIG. 5 a simple loop detector woven into the fabric matrix, FIG. 6 a detector using a pile of fibers as sensor, FIG. 7 the integration of various functional units into the fabric matrix, FIG. 8a–c a display panel or a two-dimensional photo-detector, FIGS. 9a, b, c, d principles and embodiments of memory or switching arrays according to prior art and according to the present invention, FIGS. 10a, 10b, 10c, 10d and 10e dual-conductor structures of relevance as weaving filaments, and FIG. 11 an example of an apparatus realized as a flexible sheet-like structure.

Figure 1A:
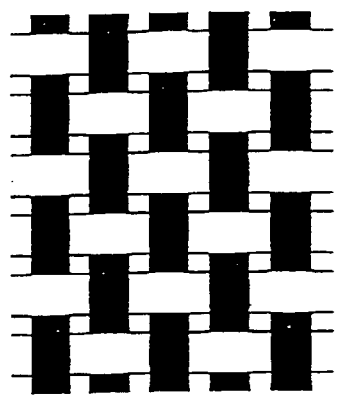
FIG. 1 shows example of basic weaves such as the plain (a), the triaxial (b), the twill (c), the leno (d) and the satin (e) weaves.

After a discussion of general aspects of the invention, examples of embodiments shall be given.

As already stated, the given objects of the invention are specifically realized by weaving, knitting, crocheting, knotting and/or stitching a combination of conducting, semiconducting, superconducting and/or insulating wires or fibers and/or optical fibers. These techniques, in the following also termed joining processes, provide a high degree of control and constructive flexibility in creating integrated physical structures with electrical and/or optical functionality in two and three dimensions.

Control is in part related to the use of strands in the weaving, knitting, crocheting, knotting and/or stitching processes that are pre-made under precisely controllable conditions before being incorporated into the final structure. Each strand can be made to include several different materials and sub-structures, e.g. in the form of electrical multiconductor cables, metallic filaments cladded with polymers that engender electronic functionality when brought into contact with other components in a woven structure, or optical fibers with cladding for protection or environmental sensing.

Control is also a consequence of the degree of topographic order in 2 and 3 dimensions that can be achieved by weaving, knitting, crocheting, knotting and/or stitching processes, where the identity and relative positions of the strands are strictly defined according to a predetermined protocol.

Flexibility in creating 2- and 3-dimensional physical structures and achieving associated electronic and/or optical functionality springs from the diversity and sophistication that can be achieved by weaving, knitting, crocheting, knotting and/or stitching processes, as demonstrated by the present state of the art within the textile industries. With the advent of woven electronics, computer-aided design and manufacturing shall become important tools for creating new architectures and processes specifically targeting the needs and opportunities in that field.

Flexibility is also achieved by the absence of fundamental physical size limits: The strands in the weave may be as long as required for any given application and the ensuing circuit or apparatus may be scaled in size, in principle without limit. The form factor, i.e. size and shape of the woven apparatus may be chosen with few constraints, examples include thin sheets as well as complex three-dimensional structures. Finally, circuits and apparatus according to the invention can be literally, physically flexible when made in a wide range of embodiments.

A major aspect of the present invention is that it provides opportunities for creating integrated circuits of a radically new type, where electronic and/or optical functionality is embedded throughout the woven, knitted, crocheted, knotted and/or stitched structures, with the strands in the structures acting as signal and power conduits and creating or promoting structural integrity. As shall be described in detailed examples below, the strands can provide many forms of functionality, either at points where different strands come into physical contact with each other and create junctions that exhibit e.g. luminescence, memory or switching behaviour, or in restricted regions where strands are exposed to external influences such as light, heat or chemical species, or distributed along portions of the length of individual strands, or at specific points where attachment has been made to discrete functional components.

FIGS. 1, 2 and 3 give examples of standard weaving and knitting patterns and combinations thereof which are applicable, bur not exclusively, to generate circuits and devices which then form an electronic or opto-electronic fabric as used in the apparatus according to the present invention.

Figure 1B:
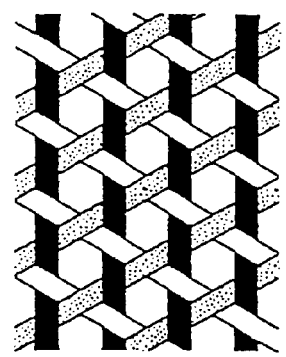
Figure 1C:
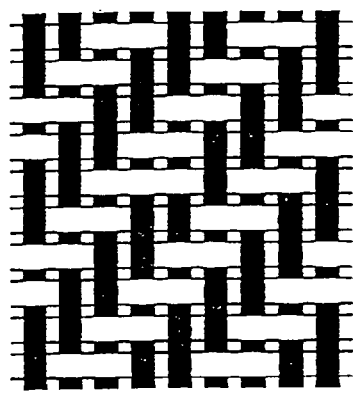
Figure 1D:
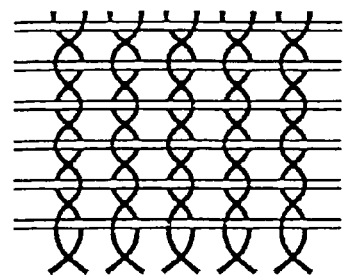
Figure 1E:
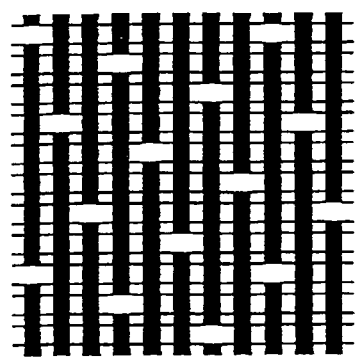
Figure 2A:
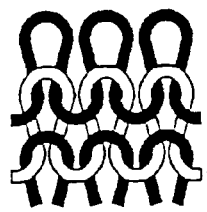
FIG. 2 shows examples of knits such as the plain (a), the double (b), a warp (tricot) (c) knits and various weft knit stitches (d)(e)
Figure 2B:
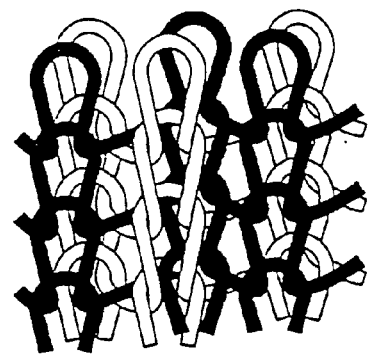
Figure 2C:
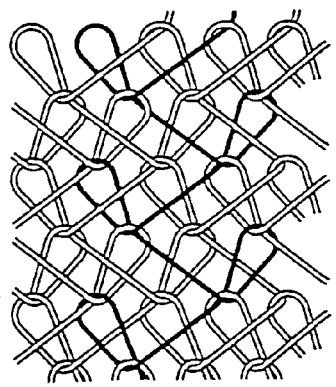
Figure 2D:
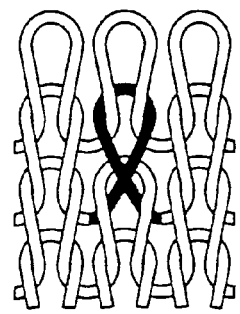
Figure 2E:
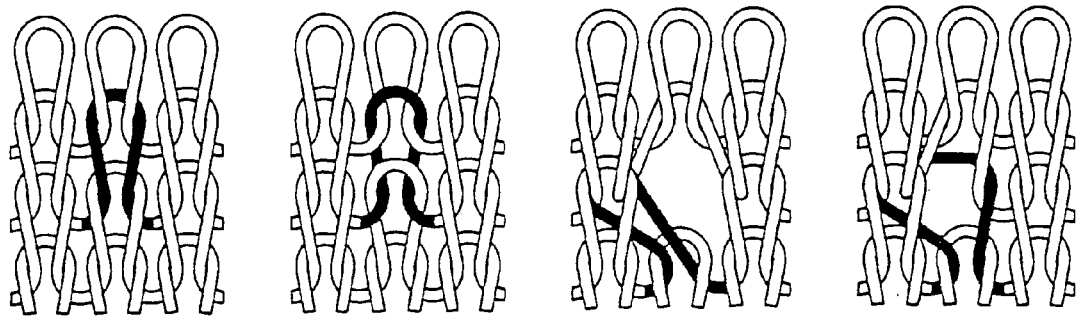
Figure 3A:
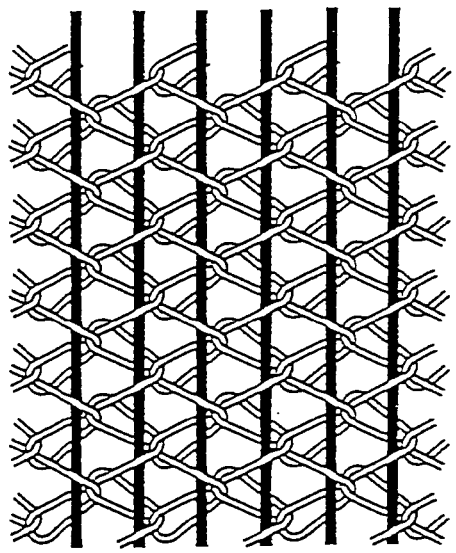
FIG. 3 shows examples of multicomponent fabrics such as the weft insertion warp knit fabric (a), pile (b) and carpet fabrics (c) and (d)
Figure 3B:
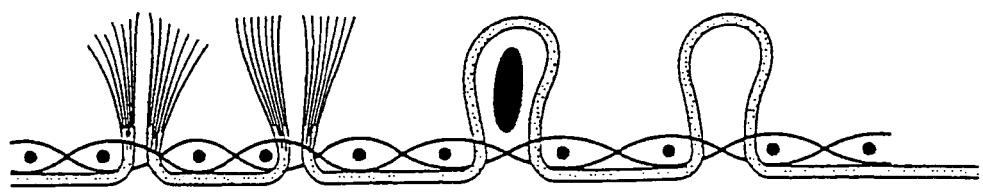
Figure 3C:
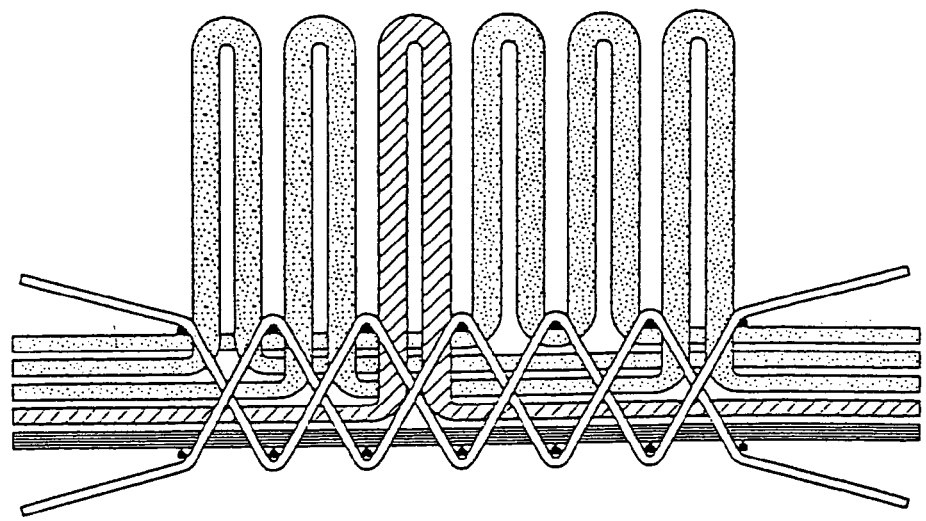
Figure 3D:
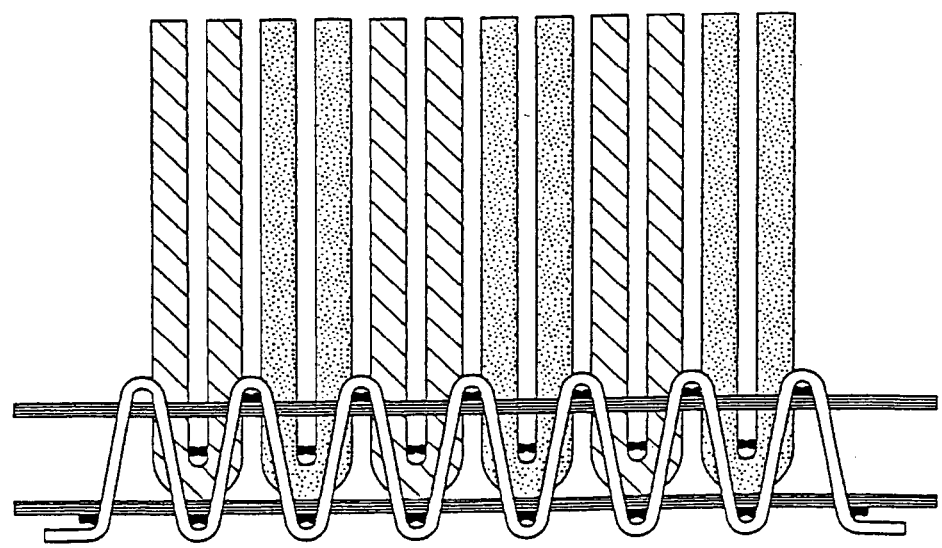

Specifically FIG. 1a shows plain weave, FIG. 1b a triaxial weave which can be regarded as a variant of the plain weave, but with diagonal wefts, FIG. 1c twill weave, FIG. 1d leno weave wherein two weft yarns are twisted around each other, and FIG. 1e satin weave. Similarly FIG. 2a shows specifically plain knit, FIG. 2b double knit, FIG. 2c tricot knit and FIGS. $2d_1-2d_5$ examples of various weft knit stitches or meshes. FIG. 3a shows specifically an example of a warp knit fabric with inserted weft, FIG. 3b a form of pile weaving wherein the weft is forming piles, and FIGS. 3c and 3d respectively two different embodiments of carpet weaves.

Figure 4A:
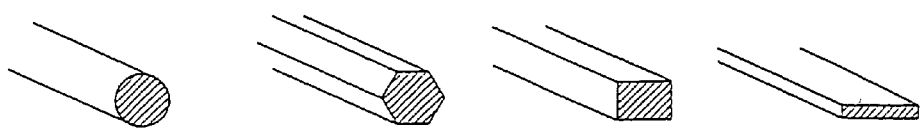
FIG. 4a–e shows examples of possible shapes and compositions of the fibers, wires and ribbons composing the electronic or optoelectronic fabric.
Figure 4B:
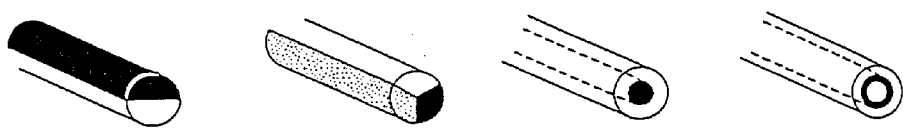
Figure 4C:
Figure 4D:
Figure 4E:
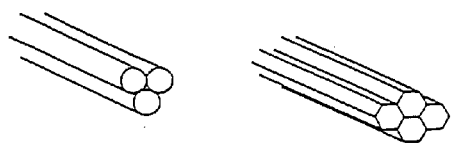

The fibers, wires, ribbons composing the circuits can have cross sections that are round, oval, square, rectangular, polygonal or any other desired shape as shown in FIG. 4a. They may be single-component or multicomponent as shown in FIG. 4b–d. For purpose of clarity these are all referred to as fibers in the following text. The components of multicomponent fibers can be arranged in different ways depending on the needs and applications. For instance a given fiber can be multicomponent in the crosssection and/or along the axis of the fiber, causing it to exhibit spatially varying physical, chemical and/or electrical properties. The single-component fibers and different components in multicomponent fibers may be either electrically conductive, semiconducting, superconducting, insulating, optically conductive or any combination thereof, but are not limited to these. The components can be any sensor or detector material such as those activated by light, heat, chemicals, electric and magnetic fields. Individual fibers, single component or multicomponent ca be bundled or braided as shown in FIG. 4e.

The electronic or optoelectronic fabric can be composed of single component or multicomponent fibers combined in various ways as exemplified by the patterns in FIGS. 1, 2 and 3. The fabric can also be assembled from bundles or braided fibers, or from more complex filament-like structures such as electrical cables with multiple conductors separated by a dielectric. Fibers of different types and different dimensions can be combined in the fabric. For example, alternating conducting and insulating fibers might be useful in some applications. The crossing of two or more fibers in the fabric are natural loci for device functionality such as memory, switches, sensors, etc. The crossing can be left as such or fused or bonded depending on the desired product.

Figure 5:
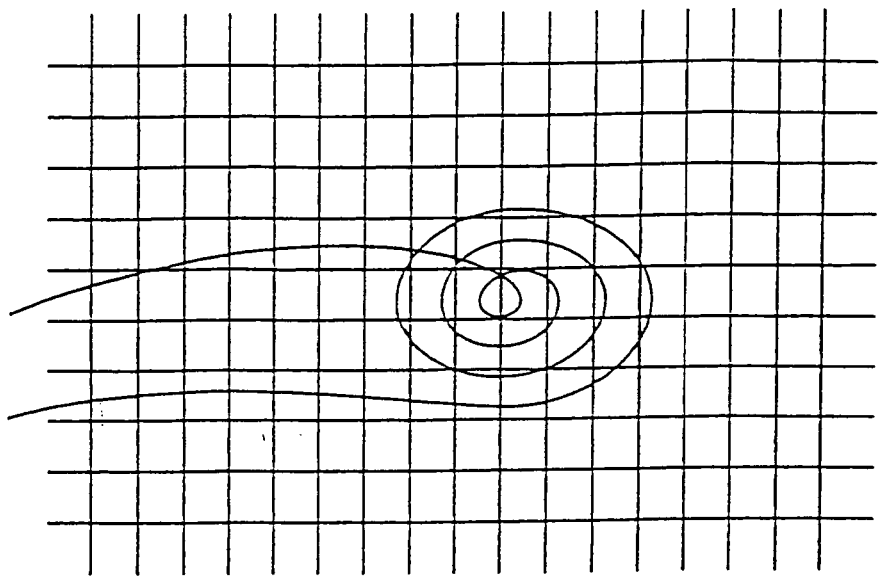
FIG. 5 shows a simple loop detector woven into the fabric matrix.

There are no size limitations for these devices by the present invention. Individual devices 100 can be created by weaving a given pattern at a chosen position in the fabric matrix as illustrated in FIG. 5 for a loop detector and in FIG. 6 for a pile sensor 120. The inclusion of a pile of small sensor fibers in the matrix will yield a high surface area detector, therefore high sensitivity. Such devices can be woven, knitted or stitched into the fabric matrix.

Figure 6:
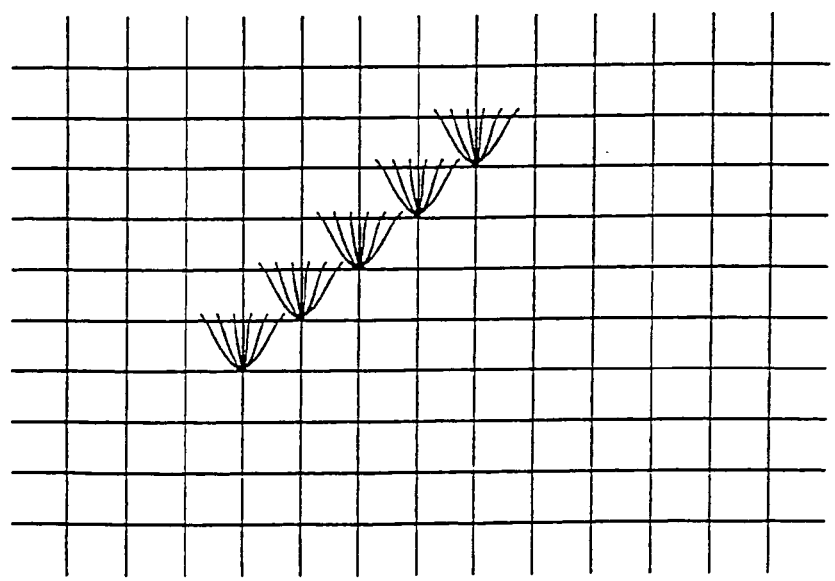
FIG. 6 shows a detector using a pile of fibers as sensor.
Figure 7:
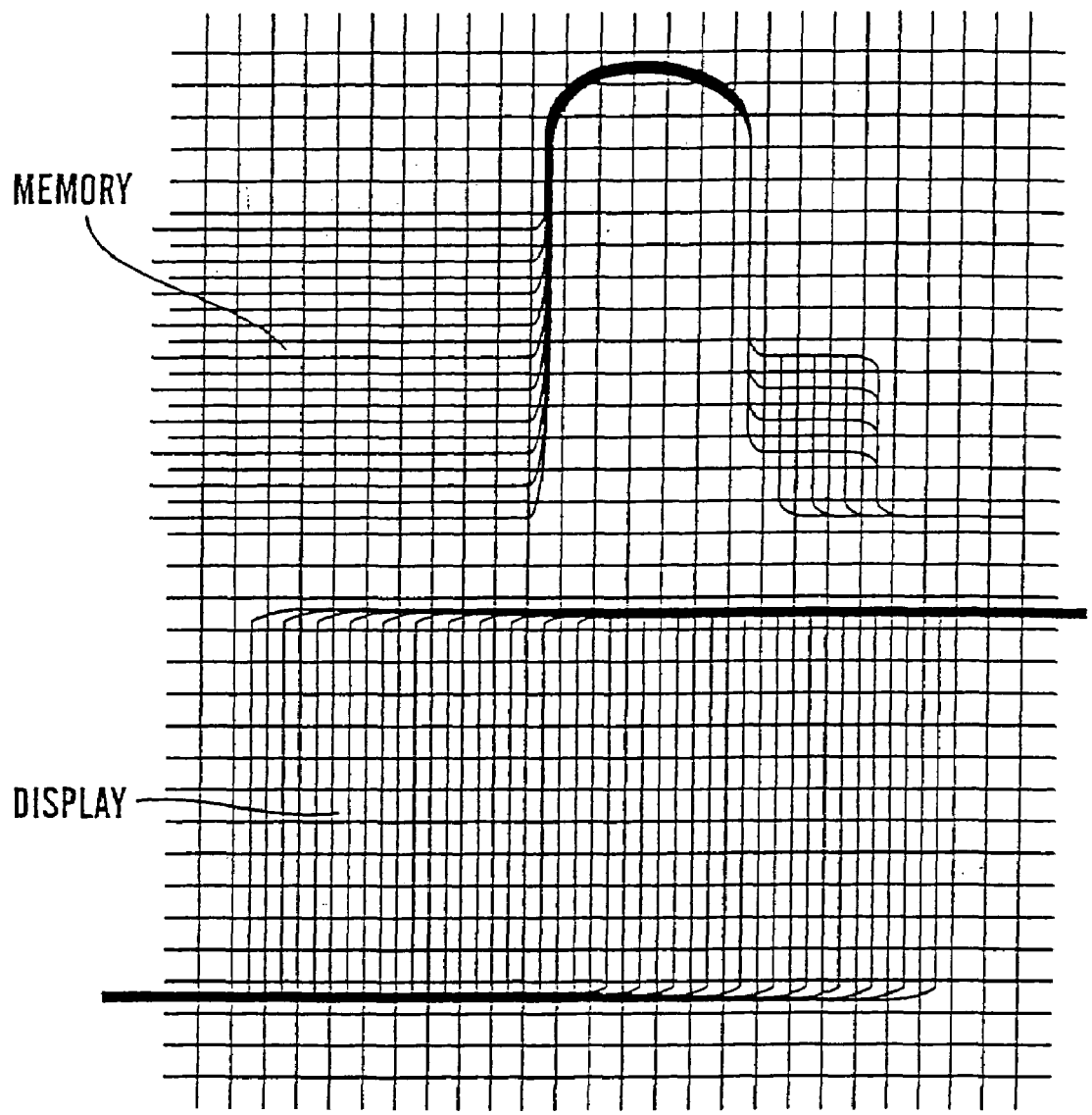
FIG. 7 shows the integration of various functional units into the fabric matrix.

There are no size limitations for these devices by the present invention. Individual devices can be created by weaving a given pattern at a chosen position in the fabric matrix as illustrated in FIG. 5 shows a loop detector formed in the fabric matrix, while FIG. 6 shows a pile sensor, i.e. the inclusion of piles of a number of small sensor fibers in the matrix, which provides a detector with large surface area and consequently high sensitivity. Such devices can be woven, knitted or stitched into the fabric matrix. Functional units in the apparatus and other devices may further be combined by being woven, stitched or knitted into a larger fabric matrix as shown in FIG. 7, which specifically shows respectively a memory device, a sensor device and a display inserted in the fabric matrix and connected to the outside thereof as shown in the figure. Multilayer knitting will also be possible in order to realize functional devices in the fabric matrix and the finished electronic fabric matrix which forms the apparatus can in a final production step be impregnated with some material or another in a suitable manner, e.g. with an insulator.

Functional components, circuits or optoelectronic devices in the apparatus according to the present invention may be addressed from the edges of the fabric or anywhere in the matrix by weaving, knitting or stitching in connecting wires.

Figure 8A:
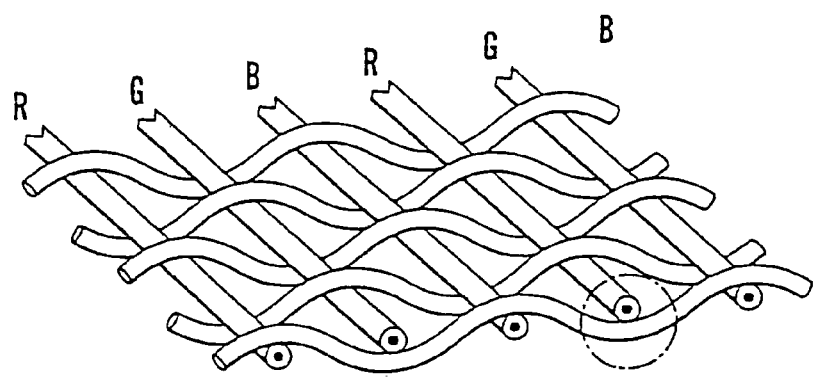
FIG. 8a–c shows a display panel or a two-dimensional photo-detector, FIGS. 9a, b, c, d shows principles and embodiments of memory or switching arrays according to prior art and according to the present invention.
Figure 8B:
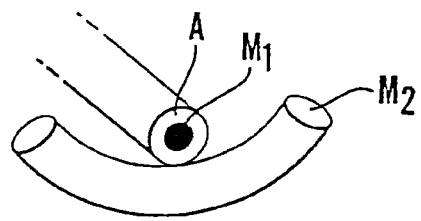
Figure 8C:
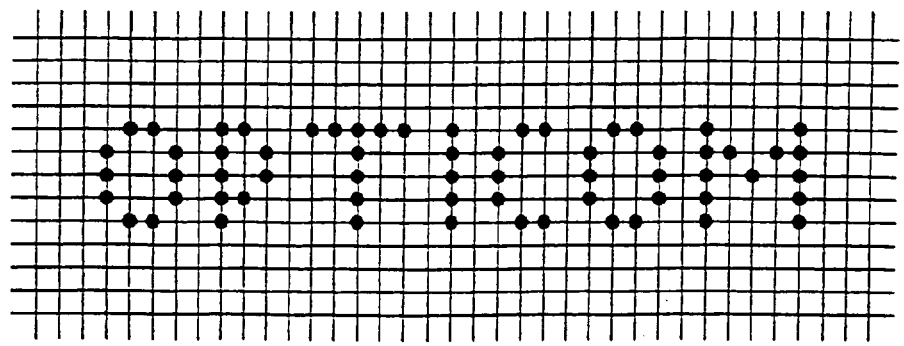

FIG. 8a–e shows a display device or two-dimensional photodetector in matrix form as rendered in FIGS. 8a, c. It is assembled by weaving two types of fibers as shown in FIGS. 8a, b. One is a bi-component fiber with a core consisting of a conducting material M1 coated with an active material A which for this embodiment is either an electroluminescent material or a photoconductive material. The other fiber is a conductor M2. M1 and M2 will typically have different work functions. Each crossing then becomes a pixel of the two-dimensional array, as in FIG. 8c. For a colour display panel, the electroluminescent material can be varied from one fiber to the next. For instance, three successive fibers will correspond to the three colours: red (R), green (G) and blue (B). Alternatively, different voltages can be used to generate different colors at each pixel. The pixel density achieved by the invention will be much higher than those of prior art. The high density of pixels in such a fabric is ideal for high definition applications.

Figure 9A:
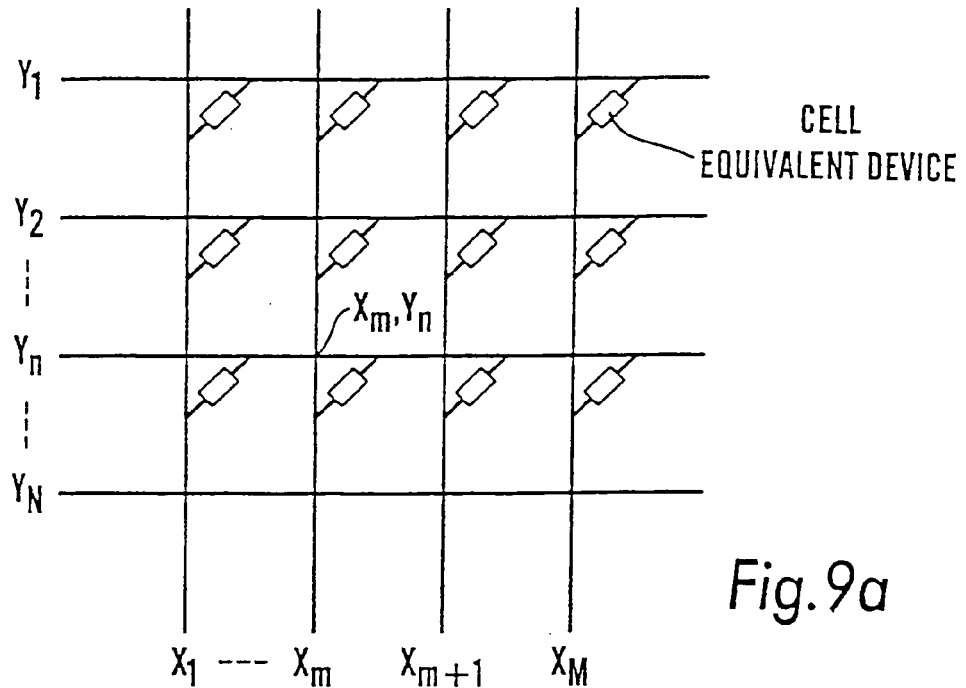

FIG. 9a shows a memory or a switching array, where specific addresses in the array are located in a crosspoint matrix fashion, i.e. by selectively activating the row and column that cross at the point where the memory or switching cell is located. Variants of this basic scheme are employed extensively in the electronics industry, often with semiconductor components embedded within the matrix structure.

Typical embodiments of crosspoint matrices within the present state of the art are built on a silicon chip, where traditional lithographic silicon technologies are used to create the conducting matrix gridlines, etc. According to the present invention, however, the rows and columns in a matrix addressing system can be formed by wires crossing each other in a weave. An example is given below.

Figure 9B:
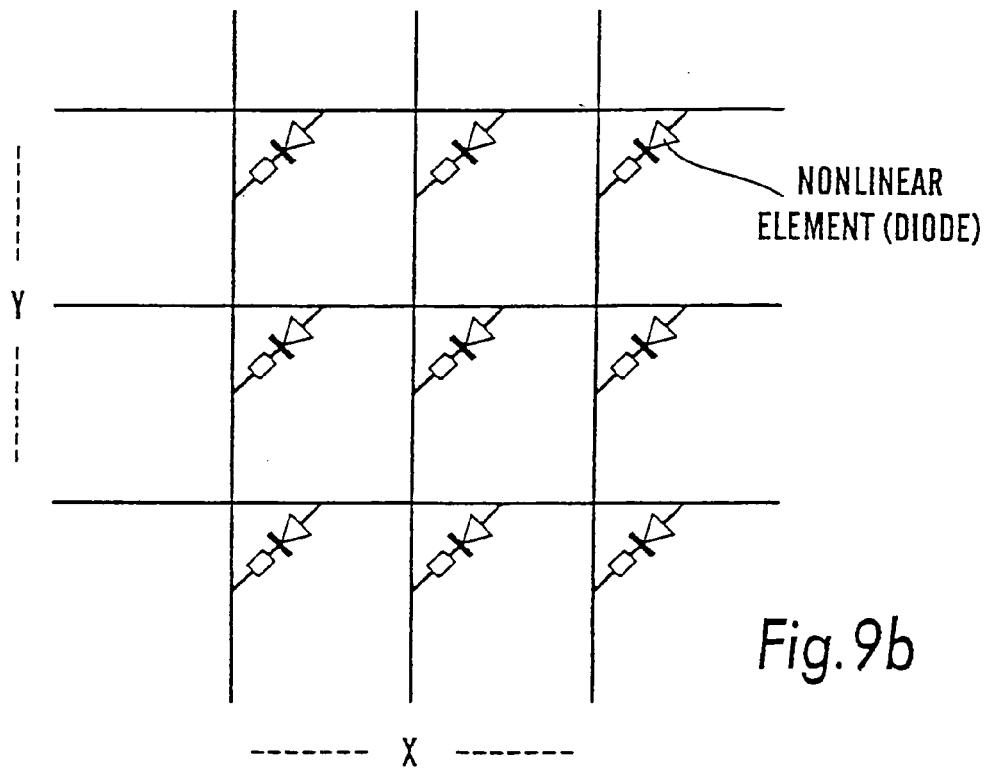

A class of memory devices that are of particular interest in conjunction with novel thin film and organic electronic materials employ passive matrices, i.e. matrices where the functional cell at each crossing point is very simple, without intra-cell transistor-based switching circuitry. One way of achieving addressability is to employ rectifying diodes to block parasitic current paths between the two wires that cross at the selected cell, cf. FIG. 9b. Such "sneak currents" are a well-known problem in passively addressed matrices, as is the remedy of inserting diodes at the crossing points. Unfortunately, achieving this by traditional semiconductor techniques (lithography, etching, doping, plating . . . ) is complicated and gives no competitive advantage over the alternatives, which are the well-known active-matrix based architectures used in ROMs, DRAMs, SRAMs, etc.

Figure 9C:
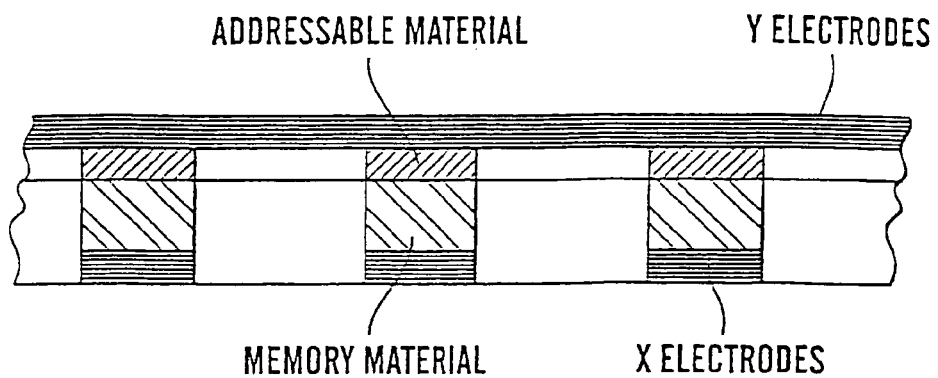

Recently, it has been shown, for instance in the International Patent Application PCT/NO98/00185 which has been assigned to the present applicant, that very compact and simple matrices with diode-connected crossing points can be made by using conjugated polymers that spontaneously create a diode junction when the polymer contacts a metal surface. This opens up opportunities for passive matrix memory devices where high-functionality organic and/or inorganic materials fill the volume between the crossing matrix electrodes, performing memory and addressability functions. A generic cell is shown in FIG. 9c. Here, one of the electrodes is contacting a material which forms a rectifying junction at the electrode/material interface, while the rest of the cell volume is filled with a memory material which controls the electrical characteristics of the cell according to the logic state (e.g. storing a logic "0" or "1"). This memory material may simply be a masked insulator in the ROM case, or it may be a material which can be switched between a high and a low impedance state to form a WORM (Write Once Read Many times) or ERASABLE (write, erase, write . . . ) memory cell. Variants of the cell in FIG. 9c include cells with only a single material which simultaneously takes care of the memory and addressability (e.g.: rectifying) functions.

In the prior art as illustrated in FIG. 9c, the cells are formed by sandwiching the material in the cell (i.e. the memory and addressability layers) between a set of bottom electrodes that are typically pre-formed on a planar substrate, and a set of top electrodes, which are typically deposited onto the material in the cell and patterned by additive or subtractive processes. The simplest and most compact solutions are obtained when the materials in the cell are part of a layer that is applied globally, without patterning. This, however, implies certain drawbacks relating to restrictions on materials that can be used, as well as the ultimate cell density achievable (lateral leak currents in the cell materials).

Figure 9D:
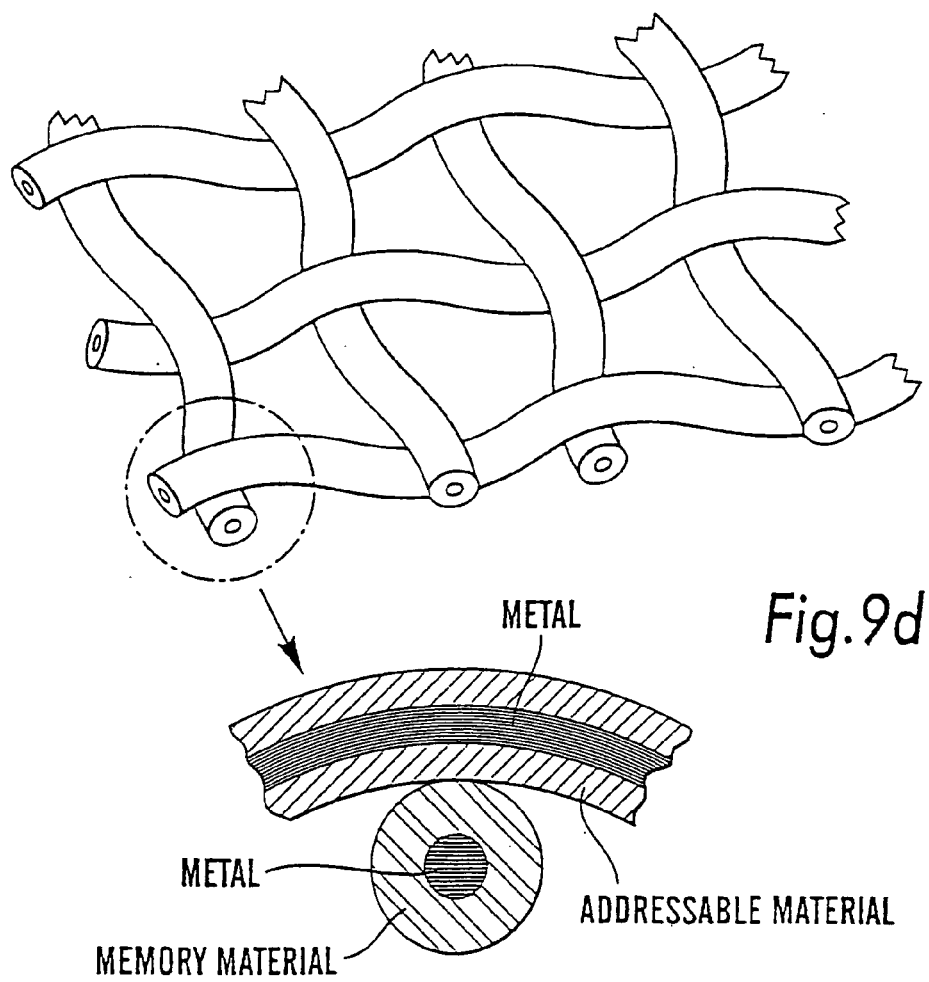

In FIG. 9d shows how a memory matrix with architecture equivalent to the one shown in FIG. 6c can be made with crossing wires that are woven such that a memory cell is formed spontaneously at each point where wires in the weave cross. In the example shown, one set of wires extend in the x direction, the other set in the y direction. Each x wire consists of a monofilament metal, cladded by a polymer which forms a rectifying junction at the metal/polymer interface. Analogously, each y wire consists of a monofilament metal cladded by a substance which exhibits memory properties. An intimate electrical connection is formed between the cladding materials at the crossing point by mechanical force on the wires (pressure or stretching) during or after the weaving operation, assisted by thermal or chemical means. The basic structure in FIG. 9c can be refined in different ways, e.g. by inserting electrically insulating separation filaments between the x and y wires in the matrix. Advantages of this woven approach are several as it provides a simple, virtually infinitely scalable means of creating passively addressed memory and switching matrices. Since the electrodes, memory and addressability materials are initially assembled as physically separated modules, one largely avoids chemical incompatibility problems which in alternative schemes severely restrict the freedom of choice in materials and architectures.

With present invention a reduction of electrical interference and related noise mechanisms shall be possible by using dual- or multiple-conductor structures as threads in the joining process.

In devices the size of present day chips and with the same wire density and operating frequencies, the fabric-like architecture shall generally be much more favourable with regards to electrical interference immunity since the wires will be separated by air which minimizes the problem (low dielectric constant). See B. Shieh & al. "Air gaps lower k of interconnect dielectrics", Solid State Technology, pp. 51–58 (February 1999). In other large devices such as displays which operate at relatively low frequencies, the woven architecture will also be favourable over existing technology.

However, devices that employ a very dense weave with mutually parallel or crossing filaments carrying signal currents at high frequencies and/or over large areas are also of particular interest in the present invention. Important examples are device architectures where memory cells, logic circuitry, amplifiers and interfacing electronics are integrated in self-contained configurations on a common substrate. Clearly, crosstalk shall be a major problem if the interconnects are laid out in close proximity to each other on the substrate without very careful attention to capacitive and inductive pickup elimination. Several of the most potent strategies in this regard are difficult or impossible to implement when traditional manufacturing technologies are used, e.g. a planar substrate with etched or deposited conducting stripes, typically in adjacent planar layers mutually separated by insulating layers.

Weaving, knitting, crocheting, knotting and/or stitching techniques provide a unique opportunity to create devices where one needs to suppress cross-talk involving conductors that carry currents within and to/from the apparatus, as well as achieving controlled signal transmission properties in those conductors. Key to this is to employ two- or multiple-conductor transmission lines with closely controlled geometries that provide balanced current paths and shielding of electromagnetic fields. Such ultra-thin transmission lines could be manufactured before being incorporated as filaments in the weave. Examples of such structures are twisted wire pairs, coaxial and certain types of stripline conductors as discussed in more detail in the following.

Using transmission lines with well-controlled electrical properties shall of course also present opportunities in addition to crosstalk suppression. An example is control of reflection properties at the terminations, of interest in high-speed circuits. Specific examples of types of transmission lines that can be embodied in the apparatus according to the invention are given below.

EXAMPLE 1

Twisted Pair Filament Conductors

Figure 10A:
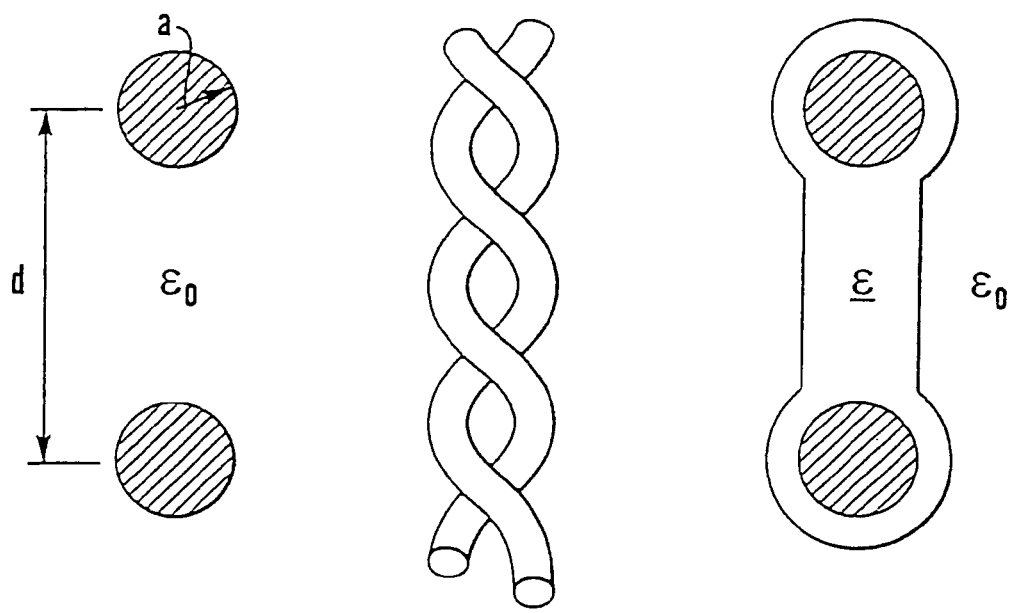
FIGS. 10a, 10b, 10c, 10d and 10e shows dual-conductor structures of relevance as weaving filaments.

See FIG. 10a. The properties are well-known and extensively described in the electronic literature. Good immunity against inductive pick-up from magnetic fields. See, e.g.: P. Horowitz and W. Hill: "The art of electronics", pp. 456 et seq., Cambridge University Press, ISBN 0-521-37095-7. Each twisted pair of conductors could be used as one of the threads in the weaving process. This thread would then be a monolithic structure, with the conductor pair maintained in the desired positions relative to each other by a rigid dielectric matrix material.

EXAMPLE 2

Coaxial Line Conductors

Figure 10B:
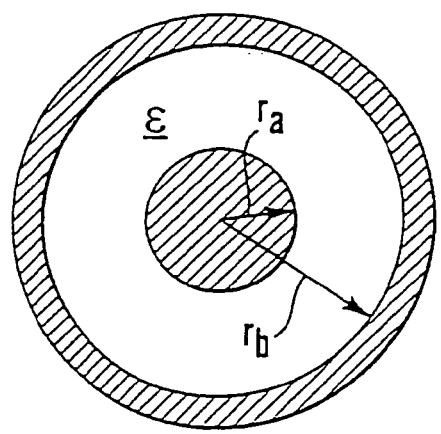

See FIG. 10b. Each coax line, with inner and outer conductors as well as dielectric filling and coating materials, would constitute one of the threads in the weaving process.

In general, for a lossless coaxial line having the radii $r_a$ and $r_b$ for the outside radius of the inner conductor and inside radius of the outer conductor, respectively, one has the following parameters.

Capacitance per unit length:

$$C = 2\pi\epsilon / \ln(r_b/r_a) \quad (1)(F/m)$$

Inductance per unit length:

$$L = (\mu/2\pi) \ln(r_b/r_a) \quad (2)(H/m)$$

Characteristic impedance:

$$Z_o = (\mu/\epsilon)^{1/2} \ln(r_b/r_a) / 2\pi \quad (3)(\Omega)$$

Propagation constant:

$$U = (\mu\epsilon)^{-1/2} \quad (4)(m/s)$$

Here, $\mu$ and $\epsilon$ are the dielectric constant (electric permittivity) and magnetic permeability, respectively, of the fill material inside the coaxial line.

A major issue is that the transmission lines must retain the electrical properties of interest even as they are scaled down in size to ultra-thin outer diameters. In that connection, one may note from the expressions above that for lossless lines the characteristic impedances and propagation constants remain unchanged under linear scaling of the physical dimensions. This naive approach is generally corroborated by more realistic and thorough studies, under certain assumptions:

Thus, the small cross-sections of the center and outer conductors imply that current paths must be short (typically a few centimeters), in order to keep resistive impedance low. This should present no problems in the present context.

Furthermore, the thin outer conductor provides poor shielding of low frequency signals, highlighting the need for avoiding open loops by precisely controlled symmetric conductor geometries and uniform material properties in the line. The advantages in this connection of pre-forming the coax line before incorporating it into the substrate by weaving, instead of making such structures in situ are self-evident.

Balanced current flows in the inner and outer conductors.

Operate at moderate to high frequencies (MHz to GHz).

EXAMPLE 3

Flaut Conductor Pair

Figure 10C:
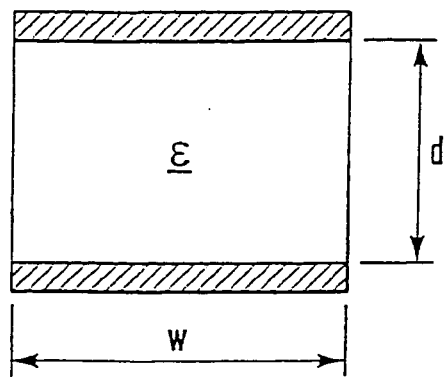
Figure 10D:
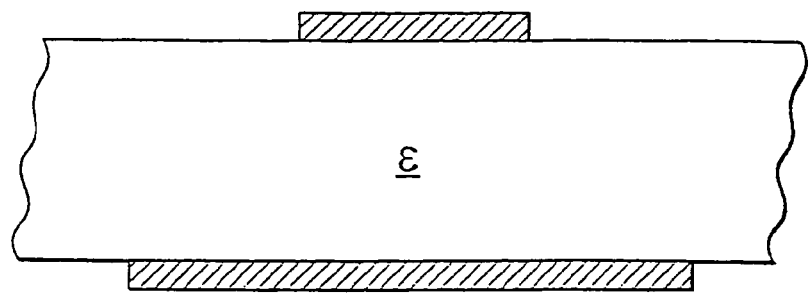
Figure 10E:

See FIGS. 10c–e, where 10c shows a planar line, 10d a strip line and 10e a symmetric strip line. Such transmission lines are high frequency signal compatible and well-known in the literature, cf., e.g.: P. Horowitz and W. Hill: "The Art of electronics", op. cit.

EXAMPLE 4

Transmission Lines in Rolled-Up Devices

Novel devices of the generic type shown in FIG. 11 shall now be discussed. Thin-film-based electronic and/or optoelectronic circuitry and components can as shown in FIG. 11a be laid out on thin, flexible substrates which may in principle be of any shape or size. Thus, the size of the memory in data storage devices can be scaled by employing a substrate of appropriate size. Very large area substrates in the form of thin, flexible foils must be packaged into practical form factors. This can be achieved by stacking, folding or rolling (FIG. 11b) together the thin device-bearing substrates, whereby also high volumetric densities ensue. A recurring problem with such schemes is how to provide electrical connections to all parts of the large areas involved. Thus, when thin sheets are stacked on top of each other, connecting wiring to each sheet or between sheets in a stack may represent an unacceptable cost or reduce technical performance.

The rolled-up scheme in FIG. 11b is attractive in that signal and power access can be established for a large-area, continuous structure, with only a few external connections entering the reel at the end of the rolled substrate. However, this solution implies that signal and power lines may become very long, extending along the full length of the rolled substrate. If traditional lithographic or printing technologies are employed to create these signal and power lines, signal attenuation along the length of the roll, reflections at signal branching and tapping points, and crosstalk between lines shall have a negative impact on technical performance, especially for high speed applications. Also, the creation of very long conducting lines by lithography or printing implies vulnerability to defects at points along the conductor. Instead, the present invention teaches the use of transmission lines in the form of multicomponent, balanced structures, i.e. micro-cables or -wires that can be manufactured to consistent high quality in a separate production step prior to being incorporated into the rolled sheet. The latter can be done in several ways, e.g.:

The transmission line can be stitched into a ribbon that provides a uniform sheet-like substrate made from e.g. a polymer.

The transmission line can constitute one of the strands in a woven ribbon-like substrate which forms the rolled-up device.

A woven or braided length of multistranded material can be glued or laminated onto a ribbon of flexible sheet substrate.

Since the transmission lines have well-defined characteristics, precise impedance matching can be used to tap the lines at separate points along the length of the rolled-up sheet without corrupting the signals.

The power and signal lines may be optical as well as electrical. In the optical case, printing and lithography techniques are even less competitive as compared to the use of fibers or cables, even over short propagation distances: Although optical waveguides deposited or etched on planar substrates are well-known, e.g. as optical circuit elements, typical propagation distances are of the order of centimeters. Optical fibers, on the other hand, are widely used in signal transmission over thousands of kilometers.

The filament diameters of relevance in woven electronics applications shall typically be small, i.e. <100 microns. There exists a large body of knowledge within the general field of joining processes, etc, derived from the textile industry, and this encompasses technologies for handling ultra-thin filaments. In the present context, however, certain new elements are introduced, i.e. the requirement that at least some of the individual filaments shall possess explicit electrical and optical transmission properties. This shall not necessarily imply any major departure from traditional weaving technologies as long as monofilaments of metals or optical glasses or plastics are concerned. However, dual- or multiple-conductor filaments represent a novel aspect, both as regards the manufacture of the conductor structures themselves and their incorporation into woven devices.

Coaxial lines are of particular interest in the present context. Micro-coaxial cables are extensively used in low power level, high frequency applications, e.g. radar signal conditioning. To our knowledge, the thinnest commercially available cables are approximately 0.5 mm. in outer diameter, i.e. too coarse for fabric-like or woven electronics applications. On the other hand, there is no principal reason why much thinner coaxial cables could not be made. Indeed, there is presently being conducted research on nanoscaled electronic devices which also includes ultraminiature electrically conducting wires and sheathed cable, cf.: Y. Zhang et al.: "Coaxial nanocable: Silicon Carbide and Silicon Oxide Sheathed with Boron Nitride and Carbon", Science, Vol. 281, pp. 973–975 (Aug. 14, 1998).

Below the connection to specific conductors at selected locations inside the weave shall be considered in more detail.

In the fabric-like or woven electronics concept, there is a need to couple selected conductors in the weave electrically to components and other conductors, at well-defined points in the weave. This task is non-trivial in cases with a highly dense weave consisting of ultra-thin, possibly coated conductors running all the way from the edge of the weave. Some basic principles that can be followed:

Insert locally a wire which is just stripped at the tip to make electrical contact while the rest of the wire is coated with an insulator. The inserting of fibers or filaments locally is a common fabric technology.

Insert an optical fiber or fiber bundle to send signals to and from a photodetector/emitter.

Post-insertion stripping or other treatment of localized areas on fibers, wires and filaments to gain access to the signal or power paths can be performed in a number of ways. For example, using openings in a patterned mask lithographically defined directly on the weave or through a membrane in proximity, selected portions of the electrically insulating material surrounding conducting wires can be removed by etching or they can be modified by doping.

Alternatively, one may employ a beam which writes the positions where conductors are to be exposed, either by direct erosion (ion beam) or indirectly via a sensitizing beam.

In many cases, it is useful to separate conducting leads in the weave from each other by inserting intermediate insulating strands in the web. This simplifies the task of avoiding unintentional stripping of the coating layer on conductors close to the one to be connected. Another way of avoiding contact with near-lying strands is to employ coated conductors with different dissolution properties for the coatings, cf. the specific following examples.

EXAMPLE 5

In a line of the "twisted pair" type consisting of two metal filaments with insulated coatings applied on each separately before being twisted together: There are two types of coating, one for the "hot", one for the "cold" filament, where the solubilities of the coatings in specific chemicals are different. The metal core in the "hot" filament would then be laid bare at a given location by selectively dissolving the coating on that filament using a chemical etchant which only attacks the "hot" filament coating.. The extent of the dissolution region could be controlled by exposure to the chemical etchant through a lithographically defined opening in a protective film.

EXAMPLE 6

A variant of Example 1 is localized selective sensitization followed by chemical etching: The "hot" filament coating would be made soluble to a given reagent in desired locations, by exposure to the sensitizing agent (vapor, liquid, light, heat, particle beam . . . ) through a lithographically defined opening in a protective film.

EXAMPLE 7

The same basic principles as in Examples 5 and 6 can be employed with other types of selective stripping methods than chemical dissolution. Such methods include dry etching by photon (e.g. eximer laser) or particle irradiation, exploiting differences in etching rates of the coatings. The latter may be linked to, e.g. different hardness of the coating materials or to differences with respect to absorption of the irradiating photons or particles, or differences in etching rates

EXAMPLE 8

Instead of using lithography to define the areas that shall be subjected to etching, one may use inkjet printing to either deposit the protective layer or the etching agent itself.

EXAMPLE 9

Instead of using lithography to define the areas that shall be subjected to etching, one may use vector or raster scanning of a light or particle beam to achieve localized etching or sensitization. This way, several production steps can be avoided.

The advantages of the present invention are several. Electronic and optoelectronic functionality can be achieved on a wide scale of complexity and degree of integration in scalable two- or three-dimensional structures that are physically robust and flexible with respect to form factor. Integration of both optical and electronic circuits is simplified since material compatibility is not an important issue. Yet another advantage of the invention is the flexibility in the circuit design which can be continuously changed and adapted to meet specific needs. Wires can be looped and structured in such a way as create functional devices at any point or area in the woven matrices. The invention also provides a simple way to produce defect-tolerant architecture. See Heath & al., op. cit.

With the present invention a whole new class of electronics and/or optoelectronic apparatus will be possible. Particularly the invention offers the possibility of initially large-area flat devices which may be made as flexible fabric-like or woven structures and thus easily be form-adapted for specific purposes, in addition to being area-scalable. Such devices shall be well-suited for creating novel display devices and may as desired be made to be integrated with active and/or passive known electronic, optoelectronic or optical devices.

The invention claimed is:

1. An apparatus with a web of circuitry, comprising:
a first plurality of circuit elements extending in a first direction; and
a second plurality of circuit elements extending in a second direction, the second direction being non-parallel to the first direction,
wherein the second plurality of circuit elements are interlaced with the first plurality of circuit elements,
wherein a plurality of intersections between the first and second plurality of circuit elements form an active region, each intersection of the plurality of intersections exhibiting circuit device characteristics, the active region operating as an electrical or optical device, and
wherein at least one circuit element of one or both of the first and second plurality of circuit elements is a transmission line.

2. The apparatus of claim 1, wherein the first and second plurality of circuit elements form a fabric-like structure.

3. The apparatus of claim 1, wherein the transmission line is formed from at least one of a twisted pair filament conductor, a coaxial line conductor, and a flat conductor pair.

4. The apparatus of claim 1, wherein each of the first and second plurality of circuit elements is a single-component fiber or a multi-component fiber.

5. The apparatus of claim 4, wherein each component of the fiber is one of electrically conductive, semi-conductive, super-conductive, and insulative.

6. The apparatus of claim 4, wherein one or more components of the fiber are capable of being activated by one or more of light, heat, chemicals, electric field, and magnetic field.

7. The apparatus of claim 4, wherein one or more of the components of the fiber are optically conductive.

8. The apparatus of claim 4, wherein at least one of the first and second plurality of circuit elements is a multi-component fiber and the multi-component fiber is multi-component in a cross section of the fiber or along the axis of the fiber or both.

9. The apparatus of claim 4, wherein the first and second plurality of circuit elements are arranged and configured to form at least one of a memory, display, and sensor.

10. The apparatus of claim 1, wherein the first and second plurality of circuit elements are configured to be arranged in two or three dimensions.

11. An apparatus with a web of circuitry, comprising:
a first plurality of circuit elements extending in a first direction; and
a second plurality of circuit elements extending in a second direction, the second direction being non-parallel to the first direction,
wherein the second plurality of circuit elements are interlaced with the first plurality of circuit elements,
wherein a plurality of intersections between the first and second plurality of circuit elements form an active region associated with circuitry, the active region operating as an optical device, and
wherein at least one circuit element of one or both of the first and second plurality of circuit elements is a transmission line.

* * * * *